(12) United States Patent
Okukawa et al.

(10) Patent No.: US 8,207,613 B2
(45) Date of Patent: Jun. 26, 2012

(54) SEMICONDUCTOR MEMORY DEVICE

(75) Inventors: Yuki Okukawa, Kawasaki (JP); Satoru Takase, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 191 days.

(21) Appl. No.: 12/718,374

(22) Filed: Mar. 5, 2010

(65) Prior Publication Data
US 2010/0237512 A1 Sep. 23, 2010

(30) Foreign Application Priority Data
Mar. 23, 2009 (JP) ................................. 2009-070849

(51) Int. Cl.
*H01L 23/48* (2006.01)
(52) U.S. Cl. ........ 257/773; 257/774; 257/776; 257/786; 257/E23.011; 257/E23.145; 257/E23.152; 257/E23.17
(58) Field of Classification Search .................. 257/773, 257/774, 776, 786, E23.011, E23.145, E23.152, 257/E23.17, E23.151, E23.175, E23.178
See application file for complete search history.

(56) References Cited

U.S. PATENT DOCUMENTS

| 7,504,724 B2 * | 3/2009 | Futatsuyama | 257/750 |
| 7,518,242 B2 * | 4/2009 | Hirai | 257/758 |
| 2008/0258129 A1 | 10/2008 | Toda | |
| 2009/0020785 A1 | 1/2009 | Takase | |
| 2011/0241225 A1 * | 10/2011 | Nagashima et al. | 257/786 |

FOREIGN PATENT DOCUMENTS

| JP | 6-125013 | 5/1994 |
| JP | 2000-332104 | 11/2000 |
| JP | 2005-522015 | 7/2005 |
| JP | 2005-522045 | 7/2005 |
| JP | 2006-344349 | 12/2006 |
| JP | 2008-66371 | 3/2008 |
| JP | 2009-26867 | 2/2009 |
| WO | WO 03/088402 A1 | 10/2003 |
| WO | WO 2005/076355 A1 | 8/2005 |

* cited by examiner

*Primary Examiner* — Jasmine Clark
(74) *Attorney, Agent, or Firm* — Oblon, Spivak, McClelland, Maier & Neustadt, L.L.P.

(57) ABSTRACT

A semiconductor memory device includes a cell array layer including a first and a second wiring, which cross each other; a third wiring formed on a first wiring layer below the cell array layer; a fourth wiring formed on a second wiring layer above the cell array layer; and a contact extending in a stacking direction for connecting the third and the fourth wiring, wherein the device further comprises a redundant wiring layer being formed between the first and the second wiring layer, the redundant wiring layer being formed with a redundant wiring having a portion extending in the same direction as at least one of the third and the fourth wiring, and the third and the redundant wiring, and the fourth and the redundant wiring being connected by a plurality of contacts arranged along the portion extending in the same direction as the third or the fourth wiring.

20 Claims, 4 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2009-70849, filed on Mar. 23, 2009, the entire contents of which are incorporated herein by reference.

BACKGROUND OF THE INVENTION

1. Field of the Invention

The present invention relates to a semiconductor memory device having a multi-layer structure in which cross-point type memory cells are stacked.

2. Description of the Related Art

There has conventionally been known a flash memory, as an electrically rewritable nonvolatile memory, which includes a memory cell array of NAND-connected or NOR-connected memory cells having a floating gate structure. A ferroelectric memory is also known as a nonvolatile fast random access memory.

On the other hand, technologies of pattering memory cells much finer include a resistance variable memory, which uses a variable resistor in a memory cell as proposed. Known examples of the variable resistor include a phase change memory element that varies the resistance in accordance with the variation in crystal/amorphous states of a chalcogenide compound; an MRAM element that uses a variation in resistance due to the tunnel magneto-resistance effect; a polymer ferroelectric RAM (PFRAM) memory element including resistors formed of a conductive polymer; and a ReRAM element that causes a variation in resistance on electrical pulse application (Patent Document 1: Japanese Patent Application Laid-Open No. 2006-344349, paragraph 0021).

The resistance variable memory may configure a memory cell with a serial circuit of a Schottky diode and a resistance variable element in place of the transistor. Accordingly, it can be stacked easily and three-dimensionally structured to achieve much higher integration advantageously (Patent Document 2: Japanese Patent Application Laid-Open No. 2005-522045).

However, in the above-mentioned memory having the multi-layer structure, the length of the wiring at the contact portion in the stacking direction increases, so that the resistance value at the contact portion increases with the micro-fabrication of the wiring pitch. Therefore, there arises a problem of increasing an IR drop.

SUMMARY OF THE INVENTION

A semiconductor memory device according to one aspect of the present invention includes a semiconductor substrate; a cell array layer which is formed above the semiconductor substrate and includes a first wiring and a second wiring, which cross each other, and a memory cell connected to the first and second wirings at an intersection thereof; a third wiring formed on a first wiring layer below the cell array layer; a fourth wiring formed on a second wiring layer above the cell array layer; and a contact extending in a stacking direction for connecting the third wiring and the fourth wiring, wherein the semiconductor memory device further comprises a redundant wiring layer being formed between the first wiring layer and the second wiring layer, the redundant wiring layer being formed with a redundant wiring having a portion extending in the same direction as at least one of the third wiring and the fourth wiring, and the third wiring and the redundant wiring, and the fourth wiring and the redundant wiring being connected by a plurality of contacts arranged along the portion extending in the same direction as the third wiring or the fourth wiring.

A semiconductor memory device according to another aspect of the present invention includes a semiconductor substrate; a cell array layer which is formed above the semiconductor substrate and includes a first wiring and a second wiring, which cross each other, and a memory cell connected to the first and second wirings at an intersection thereof; a third wiring formed on a first wiring layer below the cell array layer; a fourth wiring formed on a second wiring layer above the cell array layer; and a contact extending in a stacking direction for connecting the third wiring and the fourth wiring, wherein the semiconductor memory device further comprises a redundant wiring layer being formed between the first wiring layer and the second wiring layer, and the third wiring and the redundant wiring, and the fourth wiring and the redundant wiring being connected by a contact having a width, in the direction in which the third wiring or the fourth wiring extends, greater than a width of the third wiring or the fourth wiring.

A semiconductor memory device according to still another aspect includes a semiconductor substrate; a plurality of memory blocks formed above the semiconductor substrate in a matrix and each of which includes stacked cell array layers, the cell array layer including a first wiring and a second wiring, which cross each other, and a memory cell connected to the first and second wirings at an intersection thereof; a third wiring formed on a first wiring layer below the cell array layer; a fourth wiring formed on a second wiring layer above the cell array layer; and a contact extending in a stacking direction for connecting the third wiring and the fourth wiring, wherein the semiconductor memory device further comprises a redundant wiring layer being formed between the first wiring layer and the second wiring layer, the redundant wiring being formed on the redundant wiring layer and having a portion extending in the same direction as at least one of the third wiring and the fourth wiring, and the third wiring and the redundant wiring, and the fourth wiring and the redundant wiring being connected by a plurality of contacts arranged along the portion extending in the same direction as the third wiring or the fourth wiring.

DETAILED DESCRIPTION OF THE EMBODIMENTS

The embodiments according to the present invention will now be described with reference to the drawings.

Figure 1:
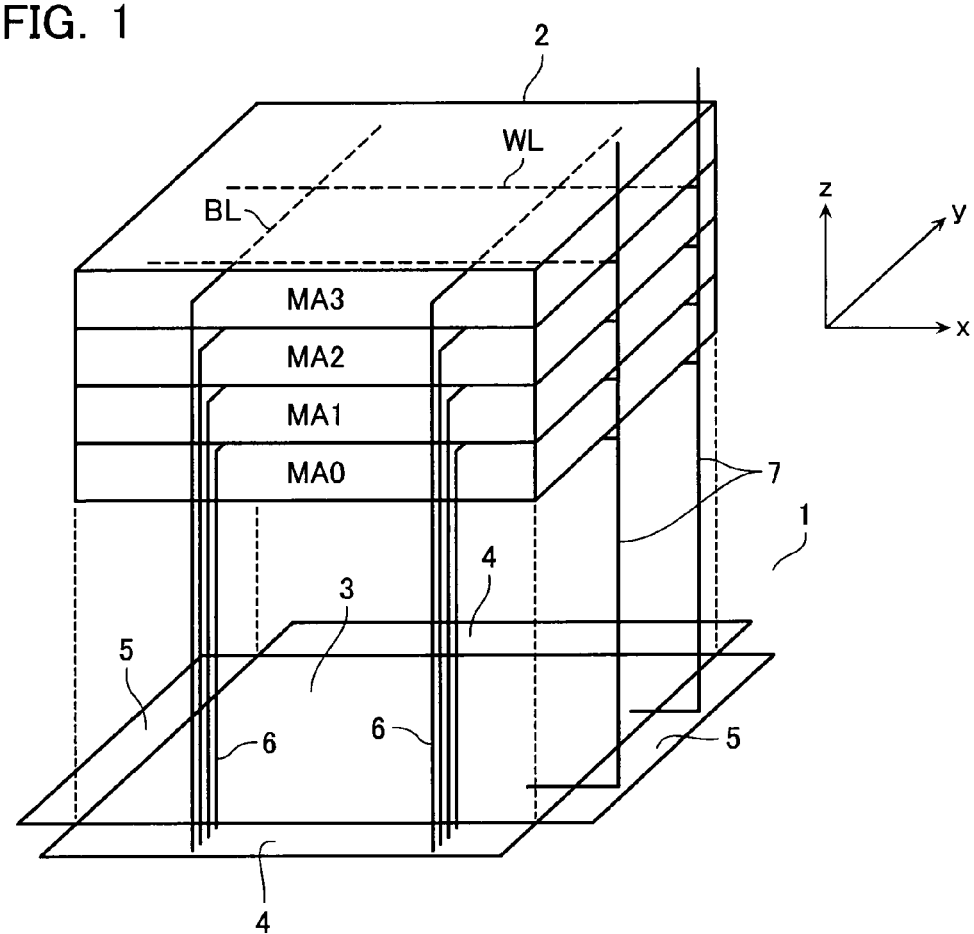
FIG. 1 is a perspective view illustrating a basic structure of a resistance variable memory device according to an embodiment of the present invention.

FIG. 1 illustrates a basic structure of a resistance variable memory device, such as ReRAM, according to the embodiment of the present invention, i.e., the structure having a semiconductor substrate 1, a wiring area 3 formed on the semiconductor substrate 1 and having wirings such as global pass formed thereon, and a memory block 2 stacked thereon.

As illustrated in FIG. 1, the memory block 2 includes four memory cell arrays MA0 to MA3 in this example. The wiring area 3 is formed on the semiconductor substrate 1 immediately below the memory block 2. The global pass or the like is provided on the wiring area 3 for externally sending and receiving data, which is to be written in the memory block 2 or read from the memory block 2. The wiring area 3 may be provided with a column control circuit including a column switch or a row control circuit including a row decoder.

A vertical wiring (via contact) is required at the side face of the memory block 2 in order to connect a word line WL that is a first wiring and a bit line BL that is a second wiring of each of the stacked memory cell arrays MA to the wiring area 3 formed on the semiconductor substrate 1. A bit-line contact area 4 and a word-line contact area 5 are formed at four sides of the wiring area 3. A bit-line contact 6 and a word-line contact 7 for connecting the bit line BL and the word line WL to a control circuit are formed at the bit-line contact area 4 and the word-line contact area 5. The word line WL is connected to the wiring area 3 through the word-line contact 7 whose one end is formed at the word-line contact area 5. The bit line BL is connected to the wiring area 3 through the bit-line contact 6 whose one end is formed at the bit-line contact area 4.

FIG. 1 illustrates a single memory block 2 having a plurality of memory cell arrays MA stacked in the direction vertical to the semiconductor substrate 1 (in a z direction in FIG. 1). However, in actuality, a plurality of the memory blocks 2 of this type is arranged in a matrix in the direction in which the word line WL extends (in an x direction in FIG. 1) and in the direction in which the bit line BL extends (in a y direction in FIG. 1).

Figure 2:
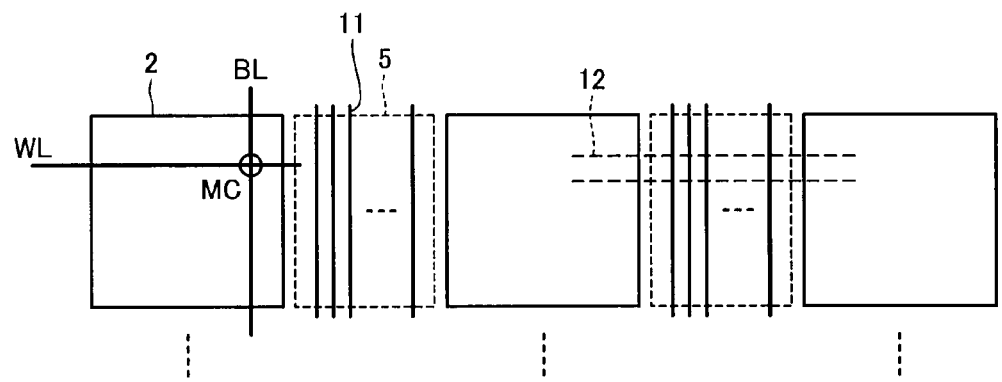
FIG. 2 is a plan view partially illustrating the resistance variable memory device according to the same embodiment.

FIG. 2 is a plan view illustrating a part of the resistance variable memory having a plurality of memory blocks 2 arranged in a matrix.

The word-line contact area 5 including a word-line driver is formed between the adjacent memory blocks 2 in the direction of the word line WL. For example, a third wiring 11 is formed on a first wiring layer M1 at the upper portion of the word-line contact area 5, while a fourth wiring 12 is formed on a second wiring layer M2 above the layer where the memory block 2 is formed.

Figure 3:
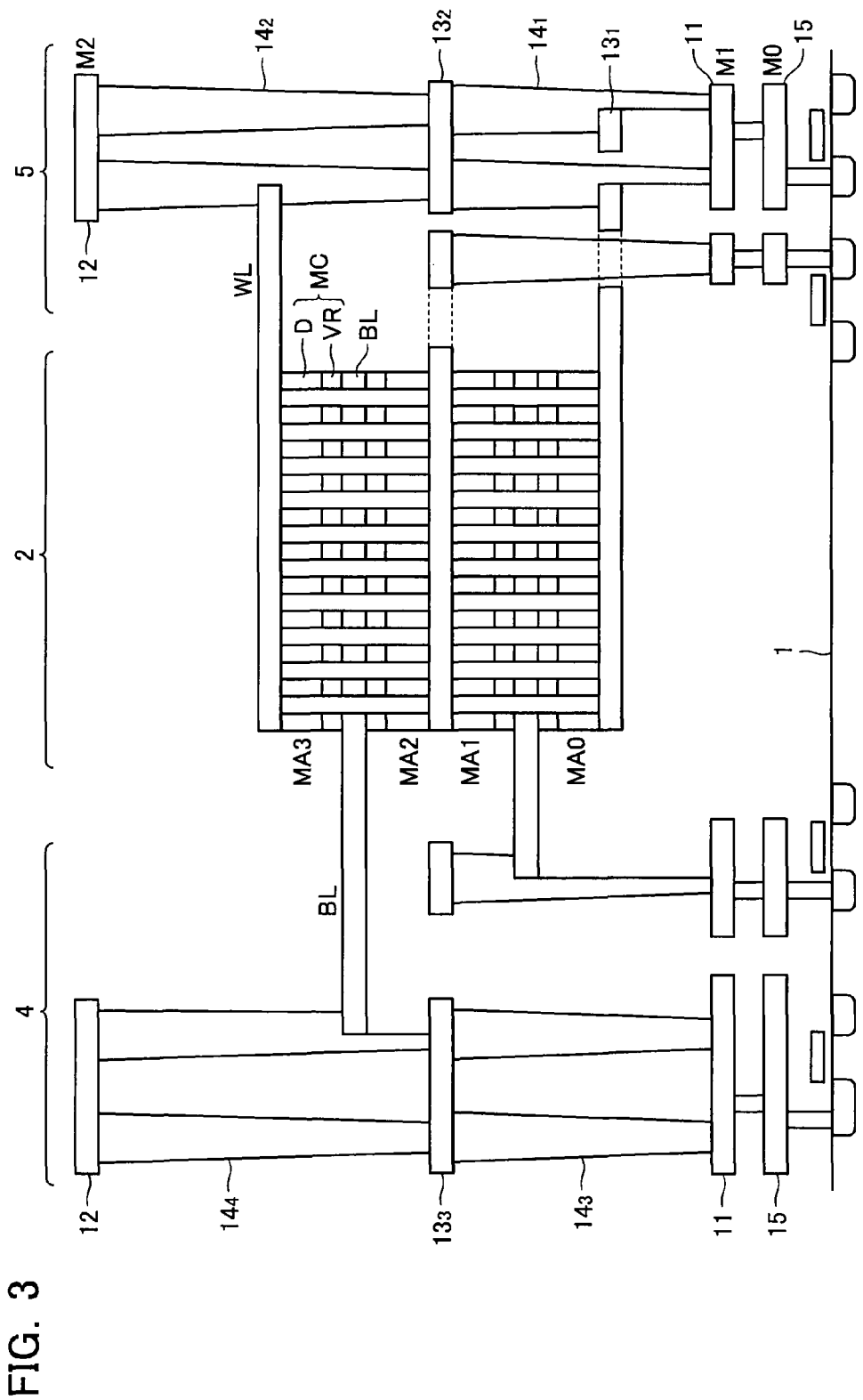
FIG. 3 is a schematic sectional view illustrating the resistance variable memory device according to the same embodiment.

FIG. 3 is a schematic sectional view of the resistance variable memory. In the figure, the bit-line contact area 4 and the word-line contact area 5 are formed at both sides of the memory block 2. However, in actuality, the bit line BL extends in the direction orthogonal to the surface of the sheet, so that the bit-line contact area 4 is arranged at both sides of the memory block 2 in the direction orthogonal to the surface of the sheet.

A 0th wiring layer M0 (wiring 15), a first wiring layer M1, and a second wiring layer M2 are formed, in this order from the semiconductor substrate 1, above the semiconductor substrate 1 as the wiring layers. The memory block 2 having the four-layer structure is formed between the first wiring layer M1 and the second wiring layer M2. Each of the memory cell arrays MA0 to MA in the memory block 2 is a cross-point memory cell array, and composed by stacking memory cells MC, each including a serial circuit made of a diode D and a variable resistor VR, between the word line WL and the bit line BL that are at right angles to each other. The third wiring 11 on the first wiring layer M1 and the fourth wiring 12 on the second wiring layer M2 are connected to each other by contacts $14_1$ to $14_4$ that extend in the stacking direction through one or plural redundant wirings $13_1$ to $13_3$ formed between both layers. The redundant wirings 13 are formed simultaneously with the word line WL or the bit line BL on the same layer as the word line WL or the bit line BL.

Next, the manner of connecting the third wiring 11, the fourth wiring 12, and the redundant wirings 13 with the contacts 14 will be described.

First Embodiment

Figure 4:
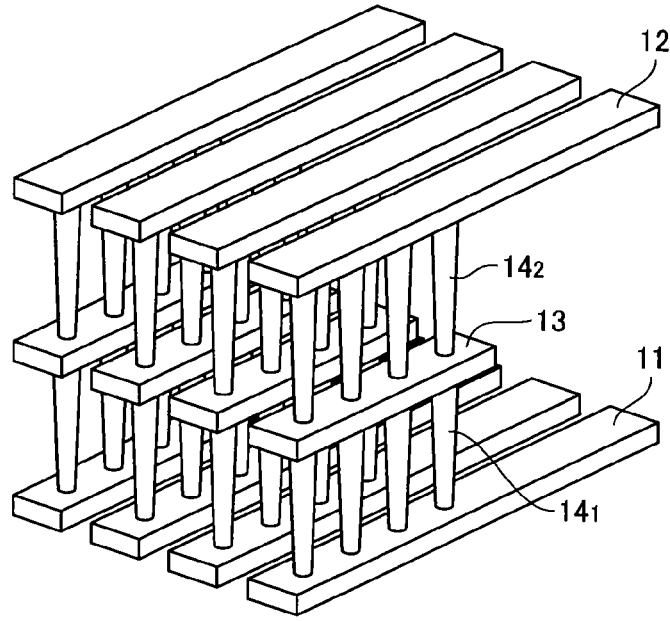
FIG. 4 is a perspective view illustrating a connection manner at a contact area according to a first embodiment.

FIG. 4 is a perspective view illustrating a connection manner of the contact area according to the first embodiment.

In this embodiment, the third wiring 11 and the fourth wiring 12 extend in parallel to each other. The redundant wiring 13 arranged between the third wiring 11 and the fourth wiring 12 also extends in the direction of the wirings 11 and 12. Specifically, the present embodiment has a reed shape. The third wiring 11 and the redundant wiring 13, and the redundant wiring 13 and the fourth wiring 12 are connected by a plurality of contacts $14_1$ and $14_2$ arranged in the longitudinal direction of the redundant wiring 13. Since the upper and lower wirings 11 and 12 are connected by the plurality of contacts $14_1$ and $14_2$, the connection resistance value between the wirings 11 and 12 can sufficiently be reduced, even if the line and space (L/S) of the wirings 11 and 12 are as finely formed as several tens of nanometers. Consequently, the influence of the IR drop can be eliminated.

Second Embodiment

Figure 5:
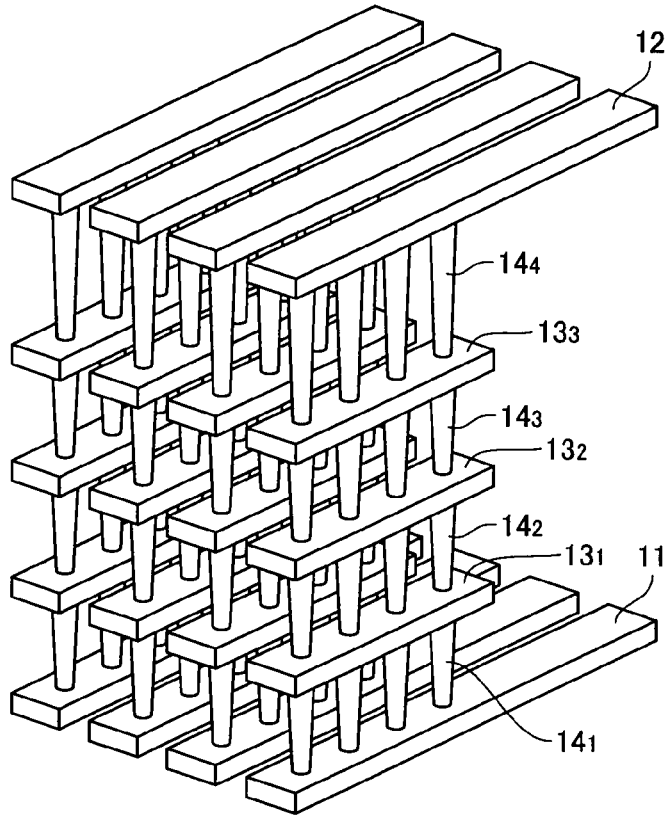
FIG. 5 is a perspective view illustrating a connection manner at a contact area according to a second embodiment.

FIG. 5 is a perspective view illustrating a connection manner of the contact area according to the second embodiment.

In the first embodiment, a single redundant wiring layer is employed. However, in the present embodiment, three redundant wiring layers are employed. The third wiring 11 and the fourth wiring 12 extend in parallel to each other. The redundant wirings $13_1$, $13_2$, and $13_3$ arranged between the third wiring 11 and the fourth wiring 12 also extend in the direction of the wirings 11 and 12. Specifically, the present embodiment has a reed shape. The third wiring 11 and the redundant wiring $13_1$, the redundant wiring $13_1$ and the redundant wiring $13_2$, the redundant wiring $13_2$ and the redundant wiring $13_3$, and the redundant wiring $13_3$ and the fourth wiring 12, are connected by a plurality of contacts $14_1$, $14_2$, $14_3$, and $14_4$ arranged in the longitudinal direction of the redundant wiring $13_1$, $13_2$, and $13_3$ respectively. In this case, the redundant wirings $13_1$, $13_2$, and $13_3$ are formed on the same layer as the word line WL or the bit line BL, so that there is no addition in the process. Further, the length of each of the contacts $14_1$, $14_2$, $14_3$, and $14_4$ can be decreased, which is advantageous upon processing.

Third Embodiment

Figure 6:
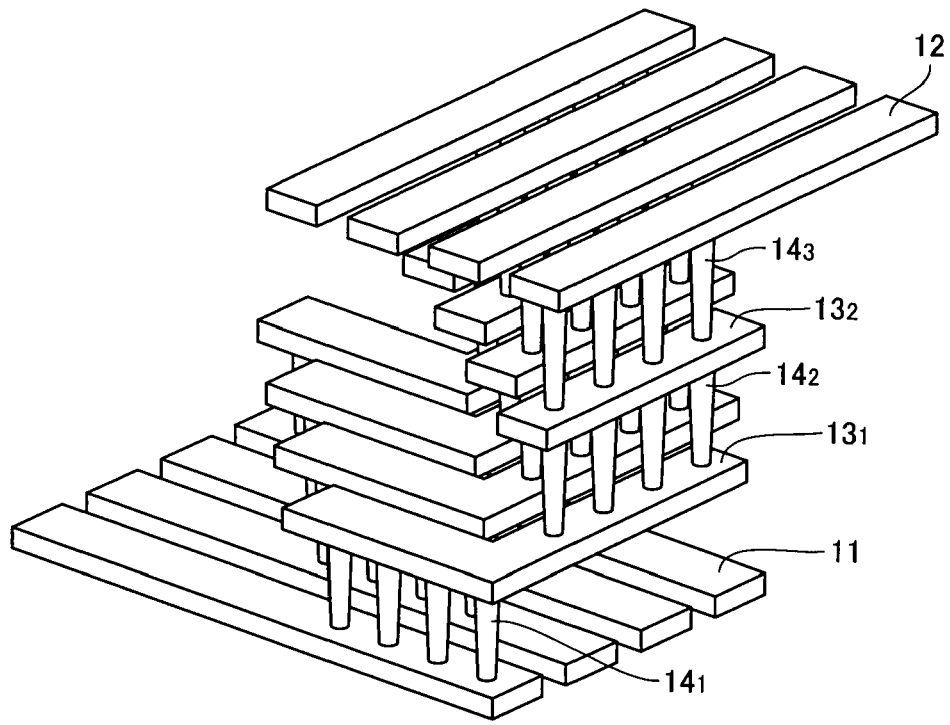
FIG. 6 is a perspective view illustrating a connection manner at a contact area according to a third embodiment.

FIG. 6 is a perspective view illustrating a connection manner of the contact area according to the third embodiment.

In the first and second embodiments, the third wiring 11 and the fourth wiring 12 are parallel to each other. In this embodiment, the third wiring 11 and the fourth wiring 12 are orthogonal to each other. The redundant wiring $13_1$ of the redundant wirings $13_1$ and $13_2$ formed between the third wiring 11 and the fourth wiring 12 is formed into an L shape having a portion extending in the direction in which the third wiring 11 extends and a portion extending in the direction in which the fourth wiring 12 extends. The third wiring 11 and the portion of the L-shaped redundant wiring $13_1$ extending in the direction in which the third wiring 11 extends are connected by a plurality of contacts $14_1$ arranged along the third wiring 11. The redundant wiring $13_1$ and the redundant wiring $13_3$, and the redundant wiring $13_2$ and the fourth wiring 12, are connected by a plurality of contacts $14_2$ and $14_3$ arranged along the fourth wiring 12. The adjacent redundant wirings $13_1$ are arranged so as to be slightly shifted respectively in the direction in which the third wiring 11 extends and in the direction in which the fourth wiring 12 extends.

According to the third embodiment, the connection resistance between the mutually orthogonal wirings 11 and 12 can be reduced.

Fourth Embodiment

Figure 7:
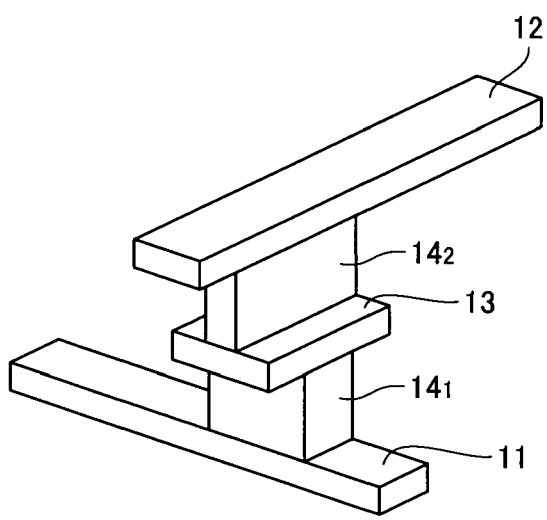
FIG. 7 is a perspective view illustrating a connection manner at a contact area according to a fourth embodiment.

FIG. 7 is a perspective view illustrating a connection manner of the contact area according to the fourth embodiment.

In this embodiment, the third wiring 11 and the fourth wiring 12 cross each other. However, the redundant wiring 13 does not have an L-shape as in the third embodiment, but has a rectangular shape. The contact $14_1$ that connects the third wiring 11 and the redundant wiring 13 is formed to have a width, in the direction in which the third wiring 11 extends, greater than the width thereof in the widthwise direction of the third wiring 11. The contact $14_2$ that connects the redundant wiring 13 and the fourth wiring 12 is formed to have a width, in the direction in which the fourth wiring 12 extends, greater than the width thereof in the widthwise direction of the fourth wiring 12. The redundant wiring 13 is formed to have the width and the length greater than the widths of the third wiring 11 and the fourth wiring 12 according to the greater width of the contacts $14_1$ or $14_2$. Since the redundant wiring 13 is formed to have the rectangular shape, the production quality is more enhanced than in the third embodiment.

Other Embodiment

The present invention is not limited to the memory cell structure. The present invention is applicable to various cross-point multi-layer memories, such as a phase change memory element, MRAM device, PFRAM, and ReRAM.

What is claimed is:
1. A semiconductor memory device comprising:
a semiconductor substrate;
a cell array layer which is formed above the semiconductor substrate and includes a first wiring and a second wiring, which cross each other, and a memory cell connected to the first and second wirings at an intersection thereof;
a third wiring formed on a first wiring layer below the cell array layer;
a fourth wiring formed on a second wiring layer above the cell array layer; and
a contact extending in a stacking direction for connecting the third wiring and the fourth wiring, wherein
the third wiring and the fourth wiring respectively extend in directions which are at right angles to each other,
the semiconductor memory device further comprises a redundant wiring formed between the first wiring layer and the second wiring layer,
the redundant wiring having a first portion extending in the same direction as an extending direction of the third wiring and a second portion extending in the same direction as an extending direction of the fourth wiring, and
the third wiring and the first portion of the redundant wiring being connected by a plurality of contacts arranged along the first portion, and the fourth wiring and the second portion of the redundant wiring being connected by a plurality of contacts arranged along the second portion.

2. The semiconductor memory device according to claim 1, wherein
the redundant wiring is formed on the same wiring layer as that of at least one of the first wiring and the second wiring of the cell array layer.

3. The semiconductor memory device according to claim 1, wherein
a plurality of redundant wirings are provided, and
a first of the redundant wirings and a second of the redundant wirings are connected to each other by the plurality of contacts.

4. The semiconductor memory device according to claim 1, wherein
the redundant wiring has the first portion and the second portion formed into an L-shape.

5. The semiconductor memory device according to claim 4, wherein
a plurality of redundant L-shaped wirings are provided, and
a first of the L-shaped redundant wirings is shifted in the extending direction of the third wiring and in the extending direction of the fourth wiring with respect to a second of the L-shaped redundant wirings formed in the same position in the stacking direction as the first L-shaped redundant wiring.

6. The semiconductor memory device according to claim 3, wherein
a first of the redundant wirings is formed into an L-shape having the first portion and the second portion, and
a second of the redundant wirings is formed into a reed shape extending in the same direction as the extending direction of the third wiring or the extending direction of the fourth wiring.

7. The semiconductor memory device according to claim 1, wherein
the memory cell includes a variable resistor.

8. The semiconductor memory device according to claim 7, wherein
the memory cell includes a diode connected to the variable resistor in series.

9. A semiconductor memory device comprising:
a semiconductor substrate;
a cell array layer which is formed above the semiconductor substrate and includes a first wiring and a second wiring, which cross each other, and a memory cell connected to the first and second wirings at an intersection thereof;
a third wiring formed on a first wiring layer below the cell array layer;
a fourth wiring formed on a second wiring layer above the cell array layer; and
a contact extending in a stacking direction for connecting the third wiring and the fourth wiring, wherein
the semiconductor memory device further comprises a redundant wiring being formed between the first wiring layer and the second wiring layer,
the redundant wiring having a portion extending in the same direction as at least one of an extending direction of third wiring or an extending direction of the fourth wiring, and
the third wiring and the redundant wiring, and the fourth wiring and the redundant wiring being connected by a contact having a width, in the direction in which the third wiring or the fourth wiring extends, greater than a width of the third wiring or the fourth wiring.

10. The semiconductor memory device according to claim 9, wherein
the redundant wiring is formed on the same wiring layer as that of at least one of the first wiring and the second wiring of the cell array layer.

11. The semiconductor memory device according to claim 9, wherein
the third wiring and the fourth wiring respectively extend in directions which are at right angles to each other, and
a width and a length of the redundant wiring are set to be greater than the widths of the third wiring and the fourth wiring.

12. The semiconductor memory device according to claim 9, wherein
the redundant wiring is formed to have a rectangular shape.

13. A semiconductor memory device comprising:
a semiconductor substrate;
a plurality of memory blocks formed above the semiconductor substrate in a matrix and each of which includes a plurality of cell array layers stacked, each of the cell array layers including a first wiring and a second wiring, which cross each other, and a memory cell connected to the first and second wirings at an intersection thereof;
a third wiring formed on a first wiring layer below the cell array layer;
a fourth wiring formed on a second wiring layer above the cell array layer; and
a contact extending in a stacking direction for connecting the third wiring and the fourth wiring, wherein
the semiconductor memory device further comprises
a redundant wiring being formed between the first wiring layer and the second wiring layer,
the redundant wiring having a portion extending in the same direction as at least one of an extending direction of the third wiring and an extending direction of the fourth wiring, and
the third wiring and the redundant wiring, and the fourth wiring and the redundant wiring being connected by a plurality of contacts arranged along the portion extending in the same direction as the extending direction of the third wiring or the extending direction of the fourth wiring.

14. The semiconductor memory device according to claim 13, wherein
the redundant wiring layer is formed on the same wiring layer as that of at least one of the first wiring and the second wiring of the cell array layer.

15. The semiconductor memory device according to claim 13, wherein
a plurality of redundant wirings are provided, and
a first of the redundant wirings and a second of the redundant wirings are connected to each other by the plurality of contacts.

16. The semiconductor memory device according to claim 13, wherein
the third wiring is orthogonal to the fourth wiring, and
the redundant wiring has a first portion extending in the same direction as the extending direction of the third wiring and a second portion extending in the same direction as the extending direction of the fourth wiring, the first portion and the second portion being formed into an L-shape.

17. The semiconductor memory device according to claim 16, wherein
a plurality of redundant L-shape wirings are provided, and
a first of the L-shaped redundant wirings is shifted in the same direction as the extending direction of the third wiring and in the same direction as the extending direction of the fourth wiring with respect to a second of the L-shaped redundant wirings adjacent to the first of the L-shaped redundant wiring.

18. The semiconductor memory device according to claim 15, wherein
the third wiring is orthogonal to the fourth wiring,
a first of the redundant wirings is formed into an L-shape having a first portion extending in the same direction as the extending direction of the third wiring and a second portion extending in the same direction as the extending direction of the fourth wiring, and
a second of the redundant wirings is formed into a reed shape extending in the same direction as the extending direction of the third wiring or the extending direction of the fourth wiring.

19. The semiconductor memory device according to claim 13, wherein
the redundant wiring is provided between the adjacent memory blocks.

20. The semiconductor memory device according to claim 13, wherein
the contact is provided in a contact area between the adjacent memory blocks.

* * * * *